(12) United States Patent  (10) Patent No.: US 7,768,068 B1
Jang et al.  (45) Date of Patent: Aug. 3, 2010

(54) DRAIN EXTENDED MOS TRANSISTOR WITH INCREASED BREAKDOWN VOLTAGE

(75) Inventors: Kevin Jang, Santa Clara, CA (US); Bill Phan, San Jose, CA (US); Helmut Puchner, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 301 days.

(21) Appl. No.: 11/758,451

(22) Filed: Jun. 5, 2007

Related U.S. Application Data

(60) Provisional application No. 60/811,298, filed on Jun. 5, 2006.

(51) Int. Cl.
 *H01L 29/735* (2006.01)
(52) U.S. Cl. .............. 257/344; 257/408; 257/336; 257/E21.435
(58) Field of Classification Search ........... 257/343, 257/328, 162, 344
See application file for complete search history.

(56) References Cited

U.S. PATENT DOCUMENTS

| | | | |
|---|---|---|---|
| 4,990,802 A | 2/1991 | Smooha | |
| 5,019,888 A | 5/1991 | Scott et al. | |
| 5,043,782 A | 8/1991 | Avery | |
| 5,140,401 A | 8/1992 | Ker et al. | |
| 5,157,573 A | 10/1992 | Lee et al. | |
| 5,173,755 A | 12/1992 | Co | |
| 5,182,220 A | 1/1993 | Ker et al. | |
| 5,218,222 A | 6/1993 | Roberts | |
| 5,237,395 A | 8/1993 | Lee | |
| 5,264,723 A | 11/1993 | Strauss | |
| 5,289,334 A | 2/1994 | Ker et al. | |
| 5,329,143 A | 7/1994 | Chan et al. | |
| 5,444,400 A | 8/1995 | Hall | |
| 5,576,557 A | 11/1996 | Ker et al. | |
| 5,591,992 A | 1/1997 | Leach | |
| 5,602,404 A | 2/1997 | Chen | |
| 5,625,522 A | 4/1997 | Watt | |
| 5,640,299 A | 6/1997 | Leach | |
| 5,670,799 A | 9/1997 | Croft | |
| 5,671,111 A | 9/1997 | Chen | |

(Continued)

OTHER PUBLICATIONS

U.S. Appl. No. 11/233,959 entitled "Silicon Controlled Rectifier Electrostatic Discharge Clamp for a High Voltage Laterally Diffused MOS Transistor," filed Sep. 23, 2005.

(Continued)

*Primary Examiner*—Jerome Jackson, Jr.
*Assistant Examiner*—Dale Page

(57) ABSTRACT

A semiconductor topography and a method for forming a drain extended metal oxide semiconductor (DEMOS) transistor is provided. The semiconductor topography includes at least a portion of an extended drain contact region formed within a well region and a plurality of dielectrically spaced extension regions interposed between the well region and a channel region underlying a gate structure of the topography. The channel region of a first conductivity type and the well region of a second conductivity type opposite of the first conductivity type. In addition, the plurality of dielectrically spaced extension regions and the extended drain contact region are of the second conductivity type. Each of the plurality of dielectrically spaced extension regions has a lower net concentration of electrically active impurities than the well region. Moreover, the extended drain contact region has a greater net concentration of electrically active impurities than the well region.

20 Claims, 3 Drawing Sheets

U.S. PATENT DOCUMENTS

| | | | |
|---|---|---|---|
| 5,675,469 | A | 10/1997 | Racino et al. |
| 5,682,047 | A | 10/1997 | Consiglio et al. |
| 5,719,733 | A | 2/1998 | Wei et al. |
| 5,754,380 | A | 5/1998 | Ker et al. |
| 5,784,242 | A | 7/1998 | Watt |
| 5,825,600 | A | 10/1998 | Watt |
| 6,066,879 | A | 5/2000 | Lee et al. |
| 6,169,309 | B1 | 1/2001 | Teggatz et al. |
| 6,281,527 | B1 | 8/2001 | Chen |
| 6,365,940 | B1 | 4/2002 | Duvvury et al. |
| 6,433,368 | B1 | 8/2002 | Vashchenko et al. |
| 6,459,127 | B1 | 10/2002 | Lee et al. |
| 6,523,266 | B2 | 2/2003 | Lee et al. |
| 6,548,874 | B1 | 4/2003 | Morton et al. |
| 6,576,934 | B2 | 6/2003 | Cheng et al. |
| 6,642,088 | B1 | 11/2003 | Yu |
| 6,696,708 | B2 | 2/2004 | Hou et al. |
| 6,900,091 | B2 | 5/2005 | Williams et al. |
| 6,906,381 | B2 * | 6/2005 | Peyre-Lavigne et al. .... 257/333 |
| 6,924,531 | B2 | 8/2005 | Chen et al. |
| 7,202,114 | B2 | 4/2007 | Salcedo et al. |
| 7,205,630 | B2 | 4/2007 | Chang et al. |
| 7,271,629 | B2 | 9/2007 | Jeon et al. |
| 7,375,398 | B2 | 5/2008 | Wang et al. |
| 2004/0004231 | A1 | 1/2004 | Peng et al. |
| 2005/0254189 | A1 | 11/2005 | Wu et al. |
| 2005/0275029 | A1 | 12/2005 | Watt |
| 2006/0274465 | A1 | 12/2006 | Wu et al. |

OTHER PUBLICATIONS

U.S. Appl. No. 11/234,255 entitled "Circuits Providing ESD Protection to High Voltage Laterally Diffused Metal Oxide Semiconductor (LDMOS) Transistors," filed Sep. 23, 2005.
Sonsky et al., "Dielectric Resurf: Breakdown voltage control by STI layout in standard CMOS," (c) 2005 IEEE, 4 pages.
USPTO Notice of Allowance for U.S. Appl. No. 11/233,959 dated Sep. 30, 2009; 7 pages.
USPTO Notice of Allowance for U.S. Appl. No. 11/233,959 dated Jun. 3, 2009; 7 pages.
USPTO Non-Final Rejection for U.S. Appl. No. 11/233,959 dated Nov. 21, 2008; 7 pages.
USPTO Requirement for Restriction/Election for U.S. Appl. No. 11/233,959 dated Jun. 3, 2008; 6 pages.
USPTO Requirement for Restriction/Election for U.S. Appl. No. 11/233,959 ated Apr. 4, 2008; 6 pages.
USPTO Advisory Action for U.S. Appl. No. 11/234,255 dated Jul. 13, 2009; 3 pages.
USPTO Final Rejection for U.S. Appl. No. 11/234,255 dated Apr. 23, 2009; 14 pages.
USPTO Final Rejection for U.S. Appl. No. 11/234,255 dated Jan. 8, 2009; 10 pages.
USPTO Requirement for Restriction/Election for U.S. Appl. No. 11/234,255 dated Sep. 3, 2008; 7 pages.
USPTO Non-Final Rejection for U.S. Appl. No. 11/234,255 dated Mar. 4, 2008; 10 pages.
USPTO Non-Final Rejection for U.S. Appl. No. 11/234,255 dated Aug. 27, 2007; 12 pages.
USPTO Requirement for Restriction/Election for U.S. Appl. No. 11/234,255 dated Jul. 5, 2007; 6 pages.
U.S. Appl. No. 08/845,302: "Fast Turn-on Silicon Controlled Rectifier (SCR) for Electrostatic Discharge (ESD) Protection," Jeffrey Watt, filed on Apr. 25, 1997; 36 pages.
USPTO Notice of Allowance for U.S. Appl. No. 08/845,302 dated May 19, 1998; 2 pages.
USPTO Non-Final Rejection for U.S. Appl. No. 08/845,302 dated Feb. 6, 1998; 9 pages.
Duvvury et al., "ESD Phenomena and Protection Issues in CMOS Output Buffers," 1987; pp. 174-180; 4 pages.
Duvvury et al., "Internal Chip ESD Phenomena Beyond the Protection Circuit," 1988; pp. 2133-2138; 6 pages.
Polgreen et al., "Improving the ESD Failure Threshold of Silicided nMOS Output Transistors by Ensuring Uniform Current Flow," 1989; pp. 167-174; 8 pages.
Duvvury et al., "Achieving Uniform nMOS Device Power Distribution for Sub-micron ESD Reliability," 1992; 92-131 through 92-134; 4 pages.
Steven H. Voldman, "ESD Protection in a Mixed Voltage Interface and Multi-Rail Disconnected Power Grid Environment in 0.50- and 0.25-um Channel Length CMOS Technologies," 1995; 94-125 through 94-134; 10 pages.
Dabral et al., "Core Claps for Low Voltage Technologies," 1994; 94-141 through 94-149; 9 pages.
Voldman et al., "Mixed-Voltage Interface ESD Protection Circuits for Advance Microprocessors in Shallow Trench and Locos Isolation CMOS Technologies," 1994; 94-277 through 94-280; 4 pages.
Jaffe et al., "Electrostatic Discharge Protection in a 4-MBIT Dram," 1990; pp. 1-6; 6 pages.
LeBlanc et al., "Proximity Effects of 'Unused' Output Buffers on ESD Performance," 1991; pp. 327-330; 4 pages.
Worley et al., "Sub-Micron Chip ESD Protection Schemes which Avoid Avalanching Junction," 1995; 95-13 through 95-20; 8 pages.
Chatterjee et al., "A Low-Voltage Triggering SCR for On-Chip ESD Protection at Output and Input Pads," 1991; pp. 21-22; 2 pages.
USPTO Notice of Allowance for U.S. Appl. No. 08/297,629 dated Oct. 28, 1996; 8 pages.
USPTO Final Rejection for U.S. Appl. No. 08/297,629 dated Jun. 10, 1996; 6 pages.
USPTO Non-Final Rejection for U.S. Appl. No. 08/297,629 dated Sep. 12, 1995; 8 pages.
USPTO Notice of Allowance for U.S. Appl. No. 08/758,336 dated Dec. 4, 1997; 2 pages.
USPTO Non-Final Rejection for U.S. Appl. No. 08/758,336 dated Aug. 13, 1997; 6 pages.
Tandan, "ESD Trigger Circuit," EOS/ESD Symposium 1994, pp. 94-120 through 94-124; 5 pages.
Merrill et al., "ESD Design Methodology," EOS/ESD Symposium 1993, pp. 93-233 through 93-237; 5 pages.
van Roozendaal et al., "Standard ESD Testing of Integrated Circuits," 1990 EOS/ESD Symposium Proceedings, pp. 119-130; 12 pages.
Watt et al., "A Hot-Carrier Trigger SCR for Smart Power Bus ESD Protection," Cypress Semiconductor Corporation, 1995 IEEE Electron Device Letters, vol. 12, No. 1, Jan. 1991; 4 pages.
Duvvury et al., "Device Integration for ESD Robustness of High Voltage Power MOSFETs," 1994, IEEE; 4 pages.
Lee et al., "Novel ESD Protection Structure with Embedded SCR LDMOS for Smart Power Technology," 40th Annual International Reliability Physics Symposium, 2002, pp. 156-161; 6 pages.
USPTO Notice of Allowance for Application No. 11/234,255 dated Feb. 5, 2010; 6 pages.

* cited by examiner

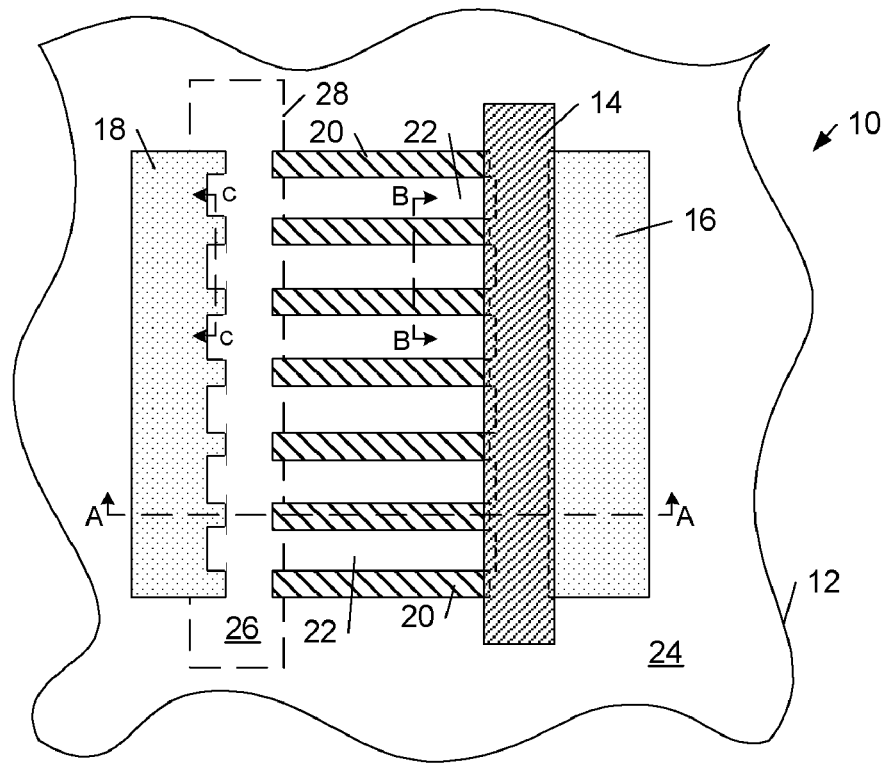
FIG. 1
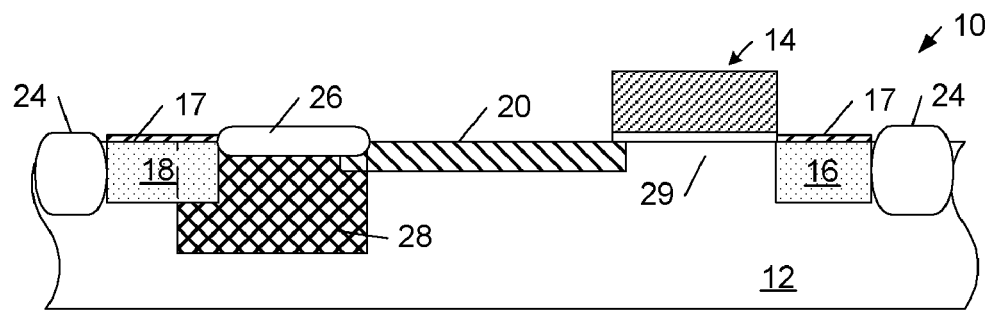
FIG. 2
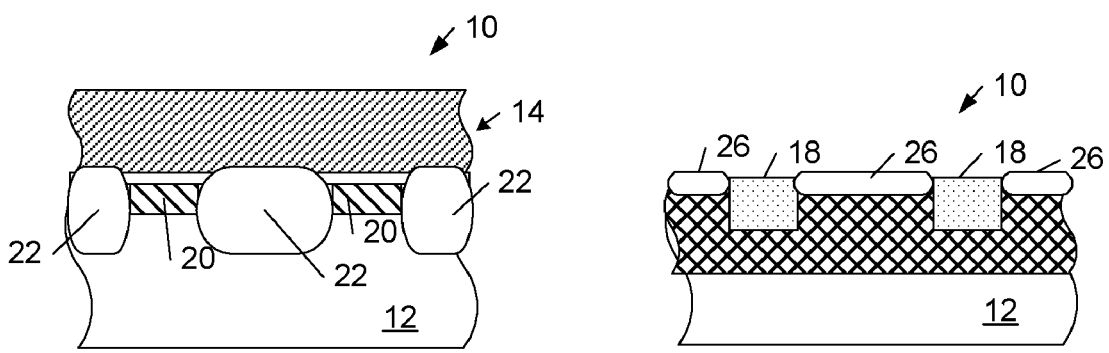
FIG. 3
FIG. 4

DRAIN EXTENDED MOS TRANSISTOR WITH INCREASED BREAKDOWN VOLTAGE

BACKGROUND OF THE INVENTION

1. Field of the Invention

The present invention relates generally to drain extended metal oxide semiconductor (DEMOS) transistors and, more specifically, to configurations for increasing the breakdown voltage of DEMOS transistors and methods for fabricating such transistors.

2. Description of the Related Art

The following descriptions and examples are given as background information only.

A transistor structure often used for high voltage applications (i.e., $V_{DD}$>5 volts) is a drain extended metal oxide semiconductor (DEMOS) transistor, which may also be referred to in the microelectronics industry as a laterally diffused metal oxide semiconductor (LDMOS) transistor. DEMOS transistors differ from other MOS transistors in that the drain contact region is laterally displaced apart from the channel of the transistor at a greater distance than the source contact region of the transistor. As a consequence of the additional voltage drop in the drain extension region, the voltage across the channel of the DEMOS transistor is lower than a transistor having a drain contact region closer to the channel and, in turn, the electric field across the gate oxide is lower. As a result, DEMOS transistors are effective for operations at high voltage levels. As with all types of transistors, the maximum voltage level a DEMOS transistor may be configured to handle depends on the breakdown voltage of the transistor. Due to their general design layout, a DEMOS transistor may be limited to the type high voltage applications (e.g., $V_{DD}$<15 volts) in which it may be used.

Accordingly, it would be beneficial to develop a DEMOS transistor with a relatively higher breakdown voltage.

SUMMARY OF THE INVENTION

The problems outlined above may be in large part addressed by a semiconductor topography having at least a portion of an extended drain contact region formed within a well region and a plurality of dielectrically spaced extension regions interposed between the well region and a channel region underlying a gate structure of the topography. The following are mere exemplary embodiments of the semiconductor topography and a method for making the semiconductor topography and are not to be construed in any way to limit the subject matter of the claims.

One embodiment of the semiconductor topography includes a channel region of a first conductivity type and a well region of a second conductivity type opposite of the first conductivity type. In addition, the plurality of dielectrically spaced extension regions and the extended drain contact region are of the second conductivity type. The extended drain contact region has a greater net concentration of electrically active impurities than the well region.

Another embodiment of the semiconductor topography includes the gate structure arranged upon a first surface portion of a semiconductor substrate, wherein the first surface portion is of a first conductivity type. In addition, the semiconductor topography includes a well region of a second conductivity type opposite to the first conductivity type formed within a second surface portion of the semiconductor substrate spaced apart from the channel region. The extended drain contact region is of the second conductivity type and has a greater net concentration of electrically active impurities than the well region. The plurality of dielectrically spaced extension regions are of the second conductivity type, extend into a portion of the well region, and are spaced apart from the extended drain contact region.

BRIEF DESCRIPTION OF THE DRAWINGS

These and various other features and advantages of the present invention will be apparent upon reading of the following detailed description in conjunction with the accompanying drawings and the appended claims provided below, where:

FIG. 1 is an exemplary plan view of a semiconductor topography including a DEMOS transistor;

FIG. 2 is an exemplary cross-sectional view of the semiconductor topography depicted in FIG. 1 taken along line AA;

FIG. 3 is an exemplary cross-sectional view of the semiconductor topography depicted in FIG. 1 taken along line BB;

FIG. 4 is an exemplary cross-sectional view of the semiconductor topography depicted in FIG. 1 taken along line CC;

Figure 5:
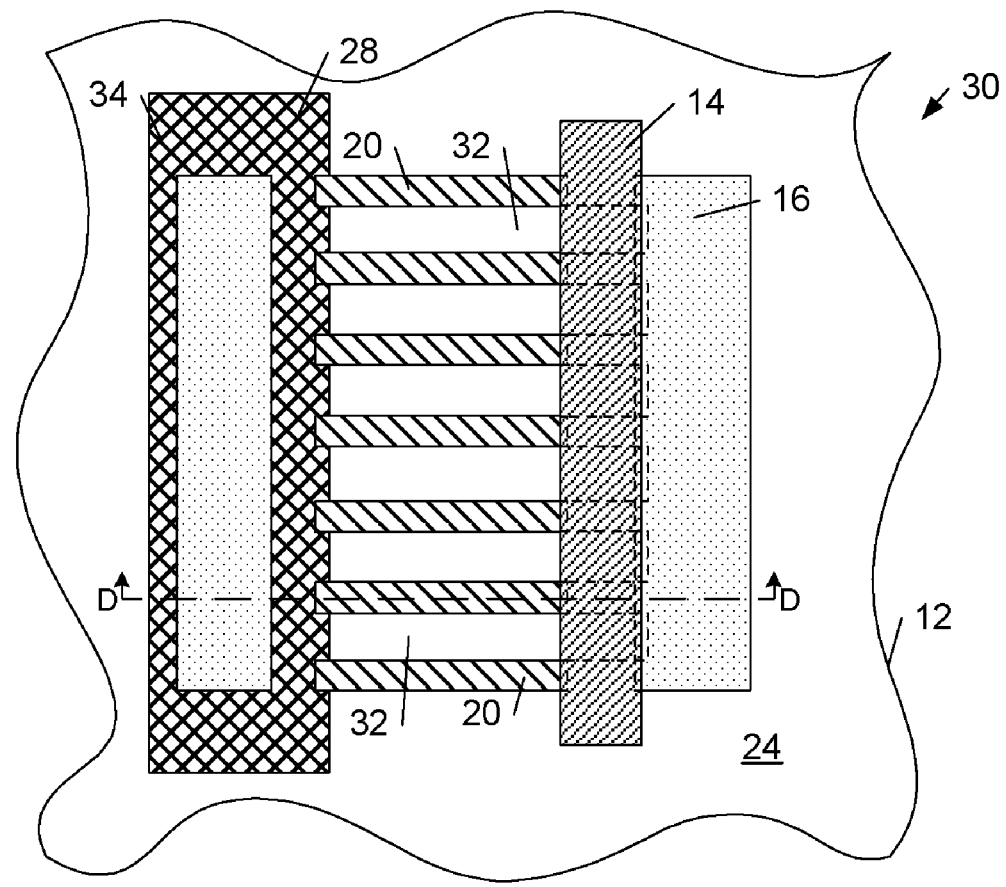
FIG. 5 is an exemplary plan view of another semiconductor topography including a DEMOS transistor of an alternative configuration.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary semiconductor topographies having drain extended metal oxide semiconductor (DEMOS) transistors with increased breakdown voltages are illustrated in FIGS. 1-6. In addition, FIG. 7 depicts a flowchart of an exemplary process for fabricating the semiconductor topographies depicted in FIGS. 1-6. As noted above, a DEMOS transistor is a MOS transistor having a drain contact region that is laterally displaced apart from the channel of the transistor at a greater distance than the source contact region is relative to channel. Such a configuration may be implemented in a variety of manners, some examples of which are shown and described below in reference to FIGS. 1-6. As noted above, a DEMOS transistor may be alternatively referenced as a laterally diffused MOS (LDMOS) transistor and, as such, the terms DEMOS and LDMOS are used interchangeably herein. It is noted that the components illustrated in FIGS. 1-6 are not necessarily drawn to scale. In particular, the scale of some elements in some of the figures may be greatly exaggerated to emphasize characteristics of the elements. In addition, it is further noted that the figures are not drawn to the same scale. Elements shown in more than one figure that may be similarly configured have been indicated using the same reference numerals.

FIG. 1 illustrates a plan view of semiconductor topography 10 having at least a portion of extended drain contact region 18 formed within well region 28 and a plurality of dielectrically spaced extension regions 20 interposed between well region 28 and channel region 29 underlying gate structure 14 of the topography. FIGS. 2-4 are cross-sectional views of semiconductor topography 10 respectively taken along lines AA, BB, and CC of FIG. 1 and, thus, are discussed in conjunction with FIG. 1. As will be described in more detail below, well region 28, extended drain contact region 18, and dielectrically spaced extension regions 20 are collectively configured and arranged to increase the breakdown voltage of the DEMOS transistor comprising semiconductor topography 10. As used herein, the term "semiconductor topography" may generally refer to a collection of layers and structures formed upon a semiconductor wafer for the fabrication of microelectronic devices. The term may, in some embodiments, refer to topographies in which fabrication of microelectronic devices are complete and are useable as and/or within integrated circuits. In other embodiments, the term may refer to topographies generated from intermediary steps of the fabrication process and, therefore, may be available for further processing to fabricate microelectronic devices.

As shown in FIGS. 1-3, semiconductor topography 10 includes gate structure 14 (including a gate electrode and an underlying gate dielectric) disposed above semiconductor substrate 12. The materials and dimensional characteristics of gate structure 14 and semiconductor substrate 12 may include any of those known in the semiconductor fabrication industry for DEMOS transistors. For instance, semiconductor substrate 12 may be a substrate include a relatively lightly doped surface layer region or an epitaxial layer (i.e., doped with a relatively light net concentration of electrically active p-type impurities or n-type impurities in the surface layer region) and, thus, may have a relatively low degree of conductivity. For example, a doping level of semiconductor substrate 12 may be generally less than or equal to approximately $1.0 \times 10^{16}$ $cm^{-3}$, more specifically between approximately $1.0 \times 10^{14}$ $cm^{-3}$ and approximately $1.0 \times 10^{16}$ $cm^{-3}$, and in some embodiments between about $5.0 \times 10^{14}$ $cm^{-3}$ and about $5.0 \times 10^{15}$ $cm^{-3}$.

As shown in FIGS. 1 and 2, semiconductor topography 10 further includes drain contact region 18 and source contact region 16 disposed within semiconductor substrate 12 on opposing sides of gate structure 14. Drain contact region 18 may be laterally displaced away from channel region 29 at a farther distance than source contact region 16 such that a DEMOS transistor is formed. As used herein, the terms "drain contact region" and "source contact region" may generally refer to the diffusion regions within the semiconductor substrate at which contact is made to allow current flow to and from the transistor. In some embodiments, cladding layer 17 may be formed over such regions to improve the electrical conductivity of connections thereto. A "channel region" may generally refer to the region under gate structure 14 which is of opposite conductivity type from source and drain contact regions 16 and 18 prior to the application of a threshold voltage to gate structure 14 and is of the same conductivity type as source and drain contact regions 16 and 18 upon application of threshold voltage to gate structure 14 allowing the conduction of current through the transistor.

In any case, drain contact region 18 and source contact region 16 may each include a net concentration of electrically active dopants opposite in conductivity type to semiconductor substrate 12. In other embodiments, drain contact region 18 and source contact region 16 may be of the same conductivity type as semiconductor substrate 12, but may be disposed within a common well region or epitaxial layer of opposite conductivity type. In such cases, at least a portion of drain contact region 18 may be further disposed within well region 28 as described in more detail below. In any case, the conductivity type of drain and source contact regions 18 and 16 may define the conductivity type of the DEMOS transistor fabricated therefrom. In particular, n-type drain and source contact regions form an n-type DEMOS (DENMOS) transistor and p-type drain and source contact regions form a p-type DEPMOS (DEPMOS) transistor. It is noted that any of the configurations of DEMOS transistors described herein may include sidewall spacers and/or lightly doped shallow regions extending from gate sidewalls and, consequently, the semiconductor topographies described herein are not necessarily limited to the illustrations of FIGS. 1-6. For instance, semiconductor topography 10 may, in some embodiments, include sidewall spacers and/or lightly doped shallow regions extending from the sidewalls of gate structure 14 with respect to either or both of drain and source contact regions 18 and 16.

In some cases, a portion of drain contact region 18 may be disposed within a well region of the same conductivity type as the drain contact region, such as noted by well region 28 in FIGS. 1 and 2. In other embodiments, the entirety of drain contact region 18 may be disposed within a well region of the same conductivity type as the drain contact region, such as denoted in the semiconductor topography configuration depicted in FIGS. 5 and 6 and described in more detail below. In either case, the well region includes a lower net concentration of electrically active impurities than drain contact region 18. The increased drain-to-substrate junction area provided by well region 28, along with the reduced dopant concentration at the drain-to-substrate junction, greatly increases the junction breakdown voltage, permitting higher voltage operation of the transistor. In general, lower net concentrations of impurities within well region 28 will reduce the dopant concentration at the drain-to-substrate junction and, thus, will provide a higher breakdown voltage for the transistor. Lower concentrations, however, increase the resistance within the device and, therefore, a trade-off exists between optimizing the breakdown voltage and on-resistance within the transistor. Consequently, in some embodiments, it may be advantageous to take into consideration resistance of the transistor when designing a DEMOS transistor to have an increased breakdown voltage. As will be described in more detail below, the breakdown voltage of the DEMOS transistor may be further increased by the inclusion of dielectrically spaced extension regions between channel region 29 and well region 28.

In an exemplary application, the inclusion of a well region (such as described in reference to well region 28) and a plurality of dielectrically spaced extension regions increased a breakdown voltage of a transistor of a given size from 12 volts to 18 volts. Larger or smaller increases in breakdown voltages, however, may be realized by such regions depending on the design specifications of a DEMOS transistor and the net concentration of impurities within the regions. In any case, as noted above, DEMOS transistors are generally used for operations employing high voltages. In reference to such transistors, the term "high voltage" may generally refer to voltages exceeding approximately 5 volts. As such, semiconductor topography 10 may generally be configured to form a DEMOS transistor having a breakdown voltage exceeding approximately 5 volts.

As noted above, drain contact region 18 may have a net concentration of electrically active impurities greater than well region 28. For instance, drain contact region 18 may have a net concentration of electrically active impurities 100 times greater than well region 28. Exemplary net concentration levels of electrically active impurities within well region 28 may be between approximately $1.0 \times 10^{16}$ and approximately $1.0 \times 10^{19}$ cm$^{-3}$, more specifically between approximately $5.0 \times 10^{16}$ and approximately $5.0 \times 10^{17}$ cm$^{-3}$, and in some embodiments around $2.0 \times 10^{17}$ cm$^{-3}$. In contrast, drain contact region 18, as well as source contact region 16, may generally have net concentration levels of electrically active impurities between approximately $1.0 \times 10^{19}$ and approximately $1.0 \times 10^{21}$ cm$^{-3}$, more specifically between approximately $1.0 \times 10^{20}$ and approximately $1.0 \times 10^{21}$ cm$^{-3}$, and in some embodiments around $1.0 \times 10^{20}$ cm$^{-3}$. Larger or smaller net concentration levels of electrically active impurities, however, may be considered for well region 28, drain contact region 18, and source contact region 16 depending on the design specifications of the semiconductor topography. In general, well region 28 may be formed to a greater depth within semiconductor substrate 12 than drain contact region 18 such that a reduced dopant concentration at the drain-to-substrate junction may be realized. The depth of well region 28 may depend on the design specifications of the device. Exemplary ranged may include depths up to approximately 7 microns, and may, in some embodiments, include depths less than approximately 2 microns and, in other embodiments, include depths between approximately 3 microns and approximately 5 microns or depths between approximately 5 microns and approximately 7 microns.

Due to the relative displacement of drain contact region 18 from channel region 29, semiconductor topography 10 includes a drain extension region between channel region 29 and well region 28 such that current may flow therebetween. As shown in FIGS. 1 and 3, the drain extension region between channel region 29 and well region 28 may include a plurality of active extension regions 20 interleaved with a plurality of dielectric regions 22. In some embodiments, extension regions 20 may extend into well region 28 spaced apart from extended drain contact region 18 as shown in FIGS. 1 and 2. In other embodiments, however, extension regions 20 may abut the sidewall of well region 28. In either case, the plurality of active extension regions 20 extend into/abut the sidewall of well region 28 closest to channel region 29. Conversely, extended drain contact region 18 may include a portion arranged along or in proximity to a side of well region 28 farthest from channel regions 29.

The plurality of active extension regions 20 are of the same conductivity type as well region 28 and drain contact region 18. In some embodiments, the plurality of active extension regions 20 may include a lower net concentration of electrically active impurities than well region 28. In other cases, however, the plurality of active extension regions 20 may include a higher net concentration of electrically active impurities than well region 28. In either embodiment, current may be passed from source contact region 16 to drain contact region 18 through channel region 29, active extension regions 20 and well region 28. In exemplary cases, each of active extension regions 20 may include up to a five fold difference in concentration of electrically active impurities as compared to well region 28. Larger net concentration levels of electrically active impurities, however, may be considered depending on the design specifications of the semiconductor topography. An exemplary range of net concentration levels of electrically active impurities within each of active extension regions 20 may be between approximately $1.0 \times 10^{15}$ and approximately $1.0 \times 10^{19}$ cm$^{-3}$, more specifically between approximately $1.0 \times 10^{16}$ and approximately $1.0 \times 10^{17}$ cm$^{-3}$.

As noted above, the inclusion of active extension regions 20 and dielectric regions 22, in addition to well region 28, advantageously increases the breakdown voltage of a DEMOS transistor fabricated from semiconductor topography 10. In particular, the inclusion of active extension regions 20 among dielectric regions 22 produces greater capacitance relative to an embodiment in which a dielectric region alone is used to separate channel region 29 and well region 28. More specifically, the total capacitance of the extension region includes junction (i.e., silicon-to-oxide) capacitance and dielectric capacitance of dielectric regions 22. The increased capacitance lowers the electric field across the transistor, in effect lowering the breakdown voltage. It is noted that dielectric regions 22 may be formed to a greater depth than extension regions 20 such that the extension regions may be adequately isolated to increase the capacitance within the drain extension region. Furthermore, it has been found that a width ratio greater than or equal to approximately 2.0 between active extension regions 20 and dielectric region 22 may contribute to increasing capacitance and, thus, larger increases in breakdown voltages within DEMOS transistors. Therefore, it may be advantageous to employ such a width ratio with semiconductor topography 10. Smaller width ratios, however, may be worth considering depending on the design specifications of the transistor.

As described above, the breakdown voltage of drain contact region 18 is affected by the inclusion of well region 28 and dielectrically spaced extension regions 20, particularly their net impurity concentrations relative to semiconductor substrate 12. In addition thereto, the distance drain contact region 18 is displaced from channel region 29 may contribute to the breakdown voltage level. More specifically, the larger than distance between the regions, the greater the breakdown voltage level. As such, the lengths of well region 28 and dielectrically spaced extension regions 20 as well as the placement of drain contact region 18 within well region 28 may be configured to increase the breakdown voltage of the DEMOS transistor. It is noted that a trade-off exists in increasing the breakdown voltage of a transistor and minimizing the size of the transistor. In particular, greater distances between channel region 29 and drain contact region 18 undesirably increase the size of the transistor. Consequently, in some embodiments, it may be advantageous to take into consideration transistor size when designing a DEMOS transistor to have an increased breakdown voltage. An exemplary distance between drain contact region 18 and channel region 29 may be between approximately 0.5 micron and approximately 10 microns, depending on the dimensional specifications of gate structure 14 as well as the doping specifications of drain and source contact regions 18 and 16, well region 28, and semiconductor substrate 12. In some embodiments, distances between approximately 1.0 micron and approximately 3.0 microns, or more specifically, around 1.5 microns may be applicable, particularly in embodiments in which the DEMOS transistor is of n-type conductivity type. Longer or shorter distances, however, may be employed, depending on the design specifications of the device.

In addition to dielectric regions 22, semiconductor topography 10 may include dielectric regions 24 and 26. Dielectric region 24 surrounds the components of the DEMOS transistor fabricated from semiconductor topography 10 such that the transistor may be isolated from other devices arranged within semiconductor substrate 12. Dielectric region 26 may be formed upon exposed surfaces of well region 28 and, in some embodiments, extend into well region 28 as shown in FIGS. 2 and 4. Since dielectric regions 22 may extend into well region 28 and/or abut the sidewall of well region 28, dielectric regions 22 may abut dielectric region 26 and, consequently, may amalgamate within well region 28 through dielectric region 26. As noted above, extension regions 20 may, in some embodiments, extend into well region 28 and, thus, dielectric region 26 may serve as a field oxide region arranged over portions of extension regions 20 extending in well region 28.

As shown in FIGS. 2 and 4, dielectric region 26 may, in some embodiments, be formed to a shallower depth than extended drain contact region 18 and/or extension regions 20 and, as such, may be formed to a shallower depth than dielectric regions 22 and/or 24. It is theorized that such a configuration may contribute to a further increase of breakdown voltage within the DEMOS transistor as well as increase the sheet resistance of the transistor, improving the overall performance of the transistor. In other embodiments, however, dielectric region 26 may be formed to approximately the same depth as dielectric regions 22 and/or 24. Such a configuration may be advantageous for minimizing fabrication steps for the device, since the dielectric regions may be formed at substantially the same time. It is noted that dielectric regions 22 may, in some embodiments, be formed to the same depth or different depths than dielectric regions 24 and/or 26 and, in some cases, may be specifically formed to a depth shallower than dielectric region 24 a depth greater than dielectric region 26.

Figure 6:
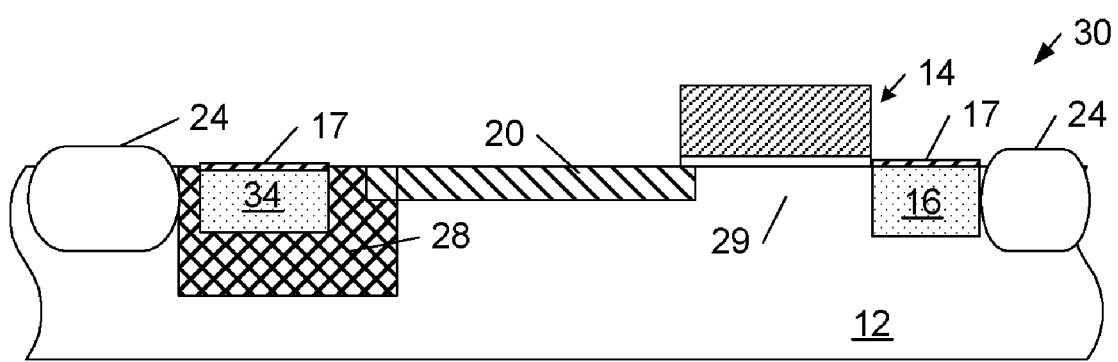
FIG. 6 is an exemplary cross-sectional view of the semiconductor topography depicted in FIG. 51 taken along line DD.
Figure 7:
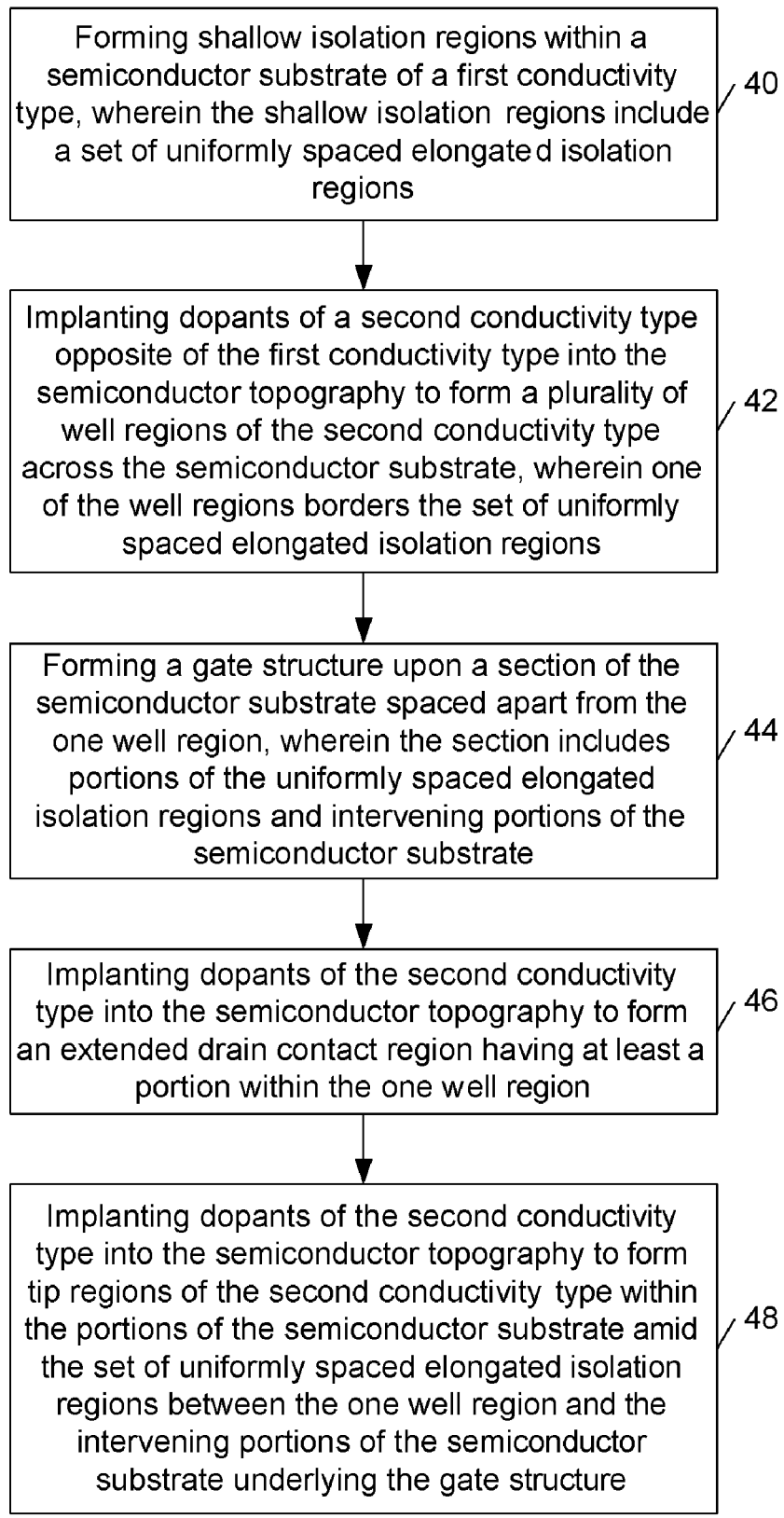
FIG. 7 is a flowchart of an exemplary process for fabricating the semiconductor topographies depicted in FIGS. 1-6.

A semiconductor topography illustrating an alternative configuration of components for DEMOS transistor is illustrated in FIGS. 5 and 6. In particular, FIG. 5 illustrates a plan view of semiconductor topography 30 having an entirety of extended drain contact region 34 formed within well region 28 and a plurality of dielectrically spaced extension regions 20 interposed between well region 28 and channel region 29 underlying gate structure 14 of the topography. FIG. 6 is a cross-sectional view of semiconductor topography 30 taken along line DD of FIG. 5 and, thus, is discussed in conjunction with FIG. 5. As shown in FIGS. 5 and 6, semiconductor topography 30 may include many of the same components as semiconductor topography 10 in FIG. 1. In general, the components in FIGS. 5 and 6 having the same reference numbers as the components shown in FIG. 1 may be substantially similar. The description of such components for semiconductor topography 10 is referenced for semiconductor topography 30 and is not reiterated for the sake of brevity.

Semiconductor topography 30 depicted in FIGS. 5 and 6 differs from semiconductor topography 10 depicted in FIGS. 1-4 by the placement of extended drain contact region 34 relative to the boundaries of well region 28. In particular, FIGS. 5 and 6 illustrate the entirety of extended drain contact region 34 arranged within well region 28. Although FIGS. 5 and 6 specifically illustrate semiconductor topography 30 having boundaries of extended drain contact region 34 spaced apart from the sides of well region 28, the semiconductor topographies described herein are not necessarily so limited. In particular, one of more boundaries of extended drain contact region 34 may alternatively be aligned with respective boundaries of well region 38. A further distinction between semiconductor topographies 30 and 10 is that extended drain contact region 34 of semiconductor topography 30 does not include the protrusions that extended drain contact region 18 in semiconductor topography 10 is depicted to include in FIG. 1. The pattern configuration of extended drain contact regions may vary among different design applications and, thus, the semiconductor topographies described herein may be configured with extended drain contact regions of any size and/or shape.

Yet another difference between the semiconductor topographies depicted in FIGS. 1-4 and 5-6 is that semiconductor topography 30 does not include a dielectric region above well region 28. The exclusion of such a region is not believed to substantially affect the isolation of extended drain contact region 34 from channel region 29 and, therefore, the performance of the DEMOS transistor fabricated therefrom is not hindered. As shown in FIG. 5, dielectric regions 32 interposed between active extension regions 20 differ from dielectric regions 22 depicted in FIG. 1 in that they extend across the channel region to source contact region 16. It is noted that the dielectric regions may alternatively extend across only a portion of channel region 29 and, therefore, different layout configurations may be considered for the semiconductor topographies described herein. In addition or alternatively, the dielectric regions may extend to extended drain contact region 34. It is noted that the distinctions between semiconductor topographies 10 and 30 are not mutually exclusive and, therefore, any one or more of such alternative configurations may be incorporated into semiconductor topography 10 or other embodiments of semiconductor topographies described herein.

As noted above, FIG. 7 depicts a flowchart of an exemplary process for fabricating the semiconductor topographies depicted in FIGS. 1-6. As shown in FIG. 7, the method may include block 40 in which shallow isolation regions are formed within a semiconductor substrate of a first conductivity type. The shallow isolation regions may include shallow isolation regions used for several different device structures within the semiconductor topography and, therefore, are not limited to those used for a DEMOS transistor. In conjunction with the fabrication of the semiconductor topographies described in FIGS. 1-6, however, the shallow isolation regions formed from block 40 may include a set of uniformly spaced elongated isolation regions, corresponding to dielectric regions 22 and 32 of FIGS. 1-6.

In addition to block 40, the method may include block 42 in which dopants of a second conductivity type opposite of the first conductivity type are implanted into the semiconductor topography to form a plurality of well regions of the second conductivity type across the semiconductor substrate. As with the formation of the shallow isolation regions, block 42 may be used to form well regions for several different device structures across the semiconductor substrate and, therefore, such a process is not restricted to the fabrication of a DEMOS transistor. It is noted that the implantation of dopants for block 42 may be performed using a single masking layer, minimizing time and costs for fabricating the well regions. In conjunction with the fabrication of the semiconductor topographies described in FIGS. 1-6, one of the well regions formed by the process of block 42 may border the set of uniformly spaced elongated isolation regions fabricated by block 40.

As shown in FIG. 7, the method may further include block 44 in which a gate structure is formed upon a section of the semiconductor substrate spaced apart from the one well region formed from block 42, wherein the section includes portions of the uniformly spaced elongated isolation regions formed from block 40 and intervening portions of the semiconductor substrate. Other gate structures may also be formed across semiconductor substrate at the same for the fabrication of other device structures. The method further includes block 46 in which dopants of the second conductivity type are implanted into the semiconductor topography to form an extended drain contact region having at least a portion within the one well region. Furthermore, the method includes block 48 in which dopants of the second conductivity type are implanted into the semiconductor topography to form tip regions of the second conductivity type within the portions of the semiconductor substrate amid the set of uniformly spaced elongated isolation regions between the one well region and the intervening portions of the semiconductor substrate underlying the gate structure. It is noted that the dopant implants of blocks 46 and 48 may be used for form doped regions for other device structures across the semiconductor substrate and, thus, such processes are not restricted to forming a DEMOS transistor.

It will be appreciated to those skilled in the art having the benefit of this disclosure that this invention is believed to provide DEMOS transistors with increased breakdown voltages. Further modifications and alternative embodiments of various aspects of the invention will be apparent to those skilled in the art in view of this description. It is intended that the following claims be interpreted to embrace all such modifications and changes and, accordingly, the drawings and the specification are to be regarded in an illustrative rather than a restrictive sense.

What is claimed is:

1. A semiconductor topography comprising a gate structure arranged upon a semiconductor substrate, wherein the semiconductor substrate comprises:
    a channel region of a first conductivity type arranged below the gate structure;
    a well region spaced apart from a channel region, wherein the well region is of a second conductivity type opposite of the first conductivity type;
    a plurality of extension regions of the second conductivity type interleaved with a plurality of oxide regions between the channel region and the well region; and
    an extended drain contact region of the second conductivity type having at least a portion arranged within the well region, wherein the extended drain contact region has a greater net concentration of electrically active impurities than the well region.

2. The semiconductor topography of claim 1, wherein the plurality of extension regions extend into the well region and are spaced apart from the extended drain contact region.

3. The semiconductor topography of claim 1, wherein the plurality of oxide regions extend into the well region.

4. The semiconductor topography of claim 3, wherein the plurality of oxide regions amalgamate within the well region, and wherein the amalgamated oxide regions comprise a field oxide region arranged over portions of the plurality of extension regions extending into the well region.

5. The semiconductor topography of claim 3, wherein the plurality of oxide regions extend to the extended drain contact region.

6. The semiconductor topography of claim 3, wherein the portions of the plurality of oxide regions within the well region are shallower than the extended drain contact region.

7. The semiconductor topography of claim 1, wherein the well region comprises a depth of up to approximately 7 microns.

8. The semiconductor topography of claim 1, wherein the well region comprises a depth of less than approximately 2 microns.

9. The semiconductor topography of claim 1, wherein the well region comprises a depth between approximately 3 microns and approximately 5 microns.

10. The semiconductor topography of claim 1, wherein the well region comprises a depth between approximately 5 microns and approximately 7 microns.

11. The semiconductor topography of claim 1, wherein the extended drain contact region has a net concentration of electrically active impurities greater than one hundred times the net concentration of electrically active impurities within the well region.

12. The semiconductor topography of claim 1, wherein each of the plurality of extension regions has a lower net concentration of electrically active impurities than the well region.

13. The semiconductor topography of claim 1, wherein each of the plurality of extension regions has a higher net concentration of electrically active impurities than the well region.

14. A semiconductor topography, comprising:
    a gate structure arranged upon a first surface portion of a semiconductor substrate, wherein the first surface portion is of a first conductivity type;
    a well region of a second conductivity type opposite to the first conductivity type formed within a second surface portion of the semiconductor substrate spaced apart from a channel region of the semiconductor substrate underlying the gate structure;
    an extended drain contact region of the second conductivity type having at least a portion arranged within the well region, wherein the extended drain contact region has a greater net concentration of electrically active impurities than the well region; and
    a plurality of oxide-spaced extension regions of the second conductivity type interposed between the channel region and the well region, wherein the plurality of oxide-spaced extension regions extend into a portion of the well region and are spaced apart from the extended drain contact region.

15. The semiconductor topography of claim 14, wherein the plurality of dielectrically oxide-spaced extension regions extend into a side of the well region closest to the channel region.

16. The semiconductor topography of claim 14, wherein at least a portion of the extended drain contact region is arranged along a side of the well region farthest from the channel region.

17. The semiconductor topography of claim 14, wherein the entirety of the extended drain contact region is arranged within the well region.

18. The semiconductor topography of claim 17, wherein boundaries of the extended drain contact region are spaced apart from sides of the well region.

19. The semiconductor topography of claim 1, wherein the extension regions of the plurality of extension regions are collectively configured and arranged to increase the breakdown voltage of a DEMOS transistor.

20. The semiconductor topography of claim 14, wherein the oxide-spaced extension regions of the plurality of oxide-spaced extension regions are collectively configured and arranged to increase the breakdown voltage of a DEMOS transistor.

* * * * *